(12) United States Patent
Oshima et al.

(10) Patent No.: US 11,004,762 B2
(45) Date of Patent: May 11, 2021

(54) SEMICONDUCTOR DEVICE, VEHICLE-MOUNTED SEMICONDUCTOR DEVICE, AND VEHICLE-MOUNTED CONTROL DEVICE

(71) Applicant: Hitachi Automotive Systems, Ltd., Hitachinaka (JP)

(72) Inventors: Takayuki Oshima, Hitachinaka (JP); Shinichirou Wada, Tokyo (JP); Katsumi Ikegaya, Hitachinaka (JP); Hiroshi Yoneda, Hitachinaka (JP)

(73) Assignee: Hitachi Automotive Systems, Ltd., Hitachinaka (JP)

( * ) Notice: Subject to any disclaimer, the term of this patent is extended or adjusted under 35 U.S.C. 154(b) by 0 days.

(21) Appl. No.: 15/744,418

(22) PCT Filed: Aug. 2, 2016

(86) PCT No.: PCT/JP2016/072578
§ 371 (c)(1),
(2) Date: Jan. 12, 2018

(87) PCT Pub. No.: WO2017/038344
PCT Pub. Date: Mar. 9, 2017

(65) Prior Publication Data
US 2018/0211898 A1 Jul. 26, 2018

(30) Foreign Application Priority Data
Sep. 4, 2015 (JP) .............................. JP2015-174308

(51) Int. Cl.
*H01L 23/367* (2006.01)
*H01L 21/76* (2006.01)
(Continued)

(52) U.S. Cl.
CPC ............ *H01L 23/367* (2013.01); *H01L 21/76* (2013.01); *H01L 21/76264* (2013.01);
(Continued)

(58) Field of Classification Search
CPC ........................ H01L 29/66681–66704; H01L 29/7816–7826; H01L 21/76; H01L 21/823481; H01L 21/76264
See application file for complete search history.

(56) References Cited

U.S. PATENT DOCUMENTS 3,704,398 A * 11/1972 Fukino ................ H01L 29/0692
257/469
5,616,950 A * 4/1997 Liu ..................... H01L 23/4824
257/287
(Continued)

FOREIGN PATENT DOCUMENTS

EP   3 346 489 A1   7/2018
JP   6-342803 A    12/1994
(Continued)

OTHER PUBLICATIONS

EPO search opinion dated Mar. 4, 2019 for EP 16841376 (Year: 2019).*
(Continued)

*Primary Examiner* — Vincent Wall
(74) *Attorney, Agent, or Firm* — Crowell & Moring LLP (57) ABSTRACT

Provided is a vehicle-mounted semiconductor device enabling a temperature increase of active elements to be restricted. A vehicle-mounted semiconductor device includes: a semiconductor substrate; a plurality of active elements formed on the semiconductor substrate; a plurality of trenches surrounding the plurality of active elements to insulate and separate the active elements; and a terminal connecting in parallel the plurality of active elements insu-
(Continued)

lated and separated by different trenches among the plurality of trenches and connected to an outside.

10 Claims, 10 Drawing Sheets

(51) Int. Cl.
  *H01L 27/02* (2006.01)
  *H01L 21/762* (2006.01)
  *H01L 27/088* (2006.01)
  *H01L 21/8234* (2006.01)
  *H01L 29/06* (2006.01)
  *H01L 29/78* (2006.01)
  *H01L 23/34* (2006.01)
  *H01L 27/12* (2006.01)

(52) U.S. Cl.
  CPC .. *H01L 21/823481* (2013.01); *H01L 23/3677* (2013.01); *H01L 27/0207* (2013.01); *H01L 27/0211* (2013.01); *H01L 27/088* (2013.01); *H01L 29/0649* (2013.01); *H01L 29/7824* (2013.01); *H01L 21/76283* (2013.01); *H01L 23/34* (2013.01); *H01L 27/1203* (2013.01); *H01L 29/0653* (2013.01)

(56) References Cited

U.S. PATENT DOCUMENTS

| | | | |
|---|---|---|---|
| 5,616,951 A | | 4/1997 | Liang |
| 5,939,755 A | * | 8/1999 | Takeuchi ............ H01L 27/1203 |
| | | | 257/347 |
| 6,439,514 B1 | | 8/2002 | Yamaguchi et al. |
| 7,535,057 B2 | * | 5/2009 | Yang ..................... H01L 29/407 |
| | | | 257/335 |
| 2002/0014639 A1 | * | 2/2002 | Imai ........................ H01L 23/34 |
| | | | 257/227 |
| 2004/0183159 A1 | | 9/2004 | Tamaki et al. |
| 2006/0138460 A1 | | 6/2006 | Sasaki et al. |
| 2006/0175635 A1 | * | 8/2006 | Arai ........................ H01L 21/84 |
| | | | 257/197 |
| 2013/0168767 A1 | * | 7/2013 | Lin ..................... H01L 27/0727 |
| | | | 257/337 |

FOREIGN PATENT DOCUMENTS

| | | |
|---|---|---|
| JP | 2001-237319 A | 8/2001 |
| JP | 2002-43521 A | 2/2002 |
| JP | 2003-86809 A | 3/2003 |
| JP | 2004-281760 A | 10/2004 |
| JP | 2006-186159 A | 7/2006 |
| JP | 2013-149876 A | 8/2013 |

OTHER PUBLICATIONS

Annex to the communication for EP 16841376 dated Apr. 9, 2020 (Year: 2020).*
International Search Report (PCT/ISA/210) issued in PCT Application No. PCT/JP2016/072578 dated Nov. 22, 2016 with English-language translation (Five (5) pages).
Japanese-language Written Opinion (PCT/ISA/237) issued in PCT Application No. PCT/JP2016/072578 dated Nov. 22, 2016 (Four(4) pages).
Written Opinion of the International Searching Authority issued in PCT Application No. PCT/JP2016/072578 dated Aug. 2, 2016 with English-language translation (Five (5) pages).
European Office Action issued in European Application No. 16841376.3 dated Oct. 28, 2020 five (5) pages).

* cited by examiner

SEMICONDUCTOR DEVICE, VEHICLE-MOUNTED SEMICONDUCTOR DEVICE, AND VEHICLE-MOUNTED CONTROL DEVICE

TECHNICAL FIELD

The present invention relates to a semiconductor device, a vehicle-mounted semiconductor device, and a vehicle-mounted control device.

BACKGROUND ART

Conventionally known is a semiconductor device arranging a plurality of active elements at irregular intervals to achieve a constant temperature (PTL 1). Also known is a semiconductor device causing a plurality of active elements to be surrounded by a trench and connecting the plurality of active elements in parallel (PTL 2).

CITATION LIST

Patent Literature

PTL 1: JP 6-342803 A
PTL 2: JP 2002-43521 A

SUMMARY OF INVENTION

Technical Problem

In the invention described in PTL 1, since the active elements are thermally connected by silicon having relatively high heat conductivity, heat generated in the active elements is easily transferred to the surrounding active elements. Thus, a distance between the active elements is extended to facilitate heat dissipation.

On the other hand, in the invention described in PTL 2, a temperature at the center of the semiconductor device is higher than a temperature at the peripheral region, and temperature restriction of the semiconductor device is desired.

Solution to Problem

A vehicle-mounted semiconductor device described in claim 1 includes: a semiconductor substrate; a plurality of active elements formed on the semiconductor substrate; a plurality of trenches surrounding the plurality of active elements to insulate and separate the active elements; and a terminal connecting in parallel the plurality of active elements insulated and separated by different trenches among the plurality of trenches and connected to an outside.

Advantageous Effects of Invention

According to the present invention, a temperature increase of active elements can be restricted.

DESCRIPTION OF EMBODIMENTS

In a power semiconductor device requiring high power output, an active element or a switching element, such as a MOSFET, enabling high current to flow into the output thereof, is used. The active element can output higher power as the size (for example, the gate width) increases. However, when high current flows, a problem occurs in which the active element is heated to a high temperature to cause resistance to breakdown such as withstanding voltage to decrease.

In particular, a vehicle-mounted semiconductor device requires control of high current as in current driving for a solenoid, and great care must thus be paid to the decrease of the resistance to breakdown. Also, the vehicle-mounted semiconductor device is often installed close to a device to be controlled, such as an engine and a motor, which is subject to a high temperature, and the ambient temperature increases. For this reason, the semiconductor device is susceptible to a high temperature and has a significantly increased risk of the decrease of the resistance to breakdown. Also, in the vehicle-mounted semiconductor device, the active element sometimes requires withstanding voltage of 40V to 200V or higher, and insulation and separation are important tasks.

First Embodiment

Figure 1A:
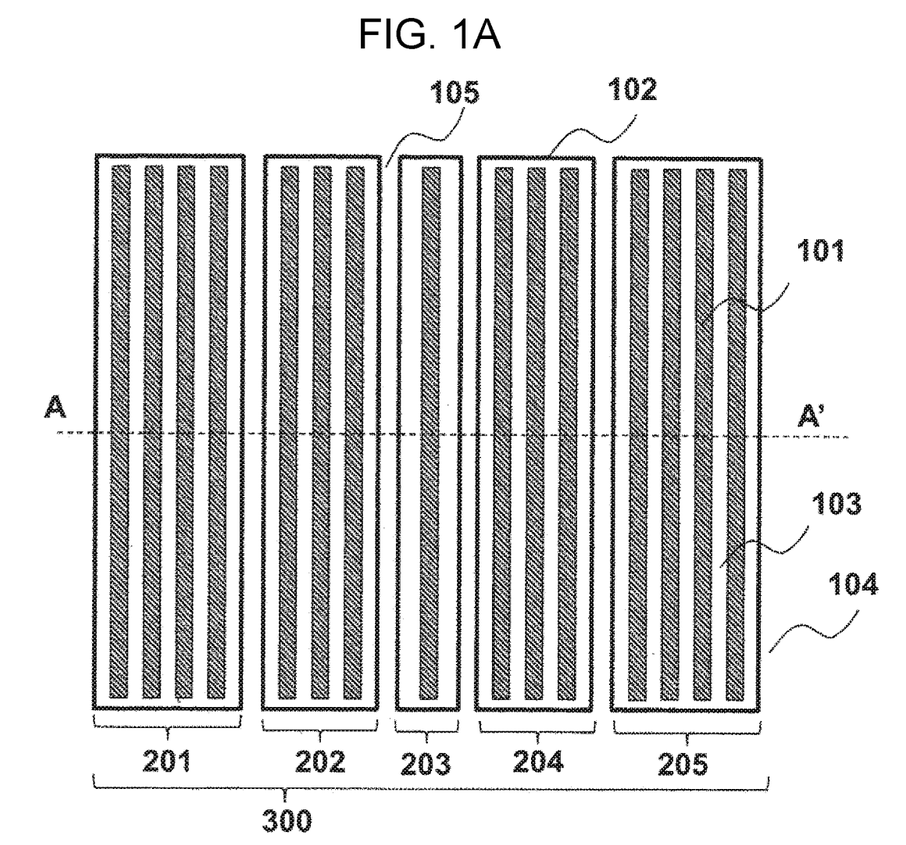
FIG. 1A is a plan view of a semiconductor device according to a first embodiment of the present invention.

FIG. 1(a) is a plan view schematically illustrating a semiconductor device according to a first embodiment of the present invention and illustrates a semiconductor device 300 in which active elements 201 to 205 formed by insulating and separating element pieces 101 by means of trenches 102 are connected in parallel. It is to be noted that, in FIG. 1(a), each of the active elements 201 and 205 is constituted by four element pieces 101, each of the active elements 202 and 204 is constituted by three element pieces 101, and the active element 203 is constituted by one element piece 101.

In a case in which each of the element pieces 101 surrounded by the trenches 102 in the semiconductor device 300 in FIG. 1 (a) is a MOSFET and has a longer gate width, that is, has a larger area, the element piece 101 has a greater ability to pass current therethrough. Also, for example, a MOSFET controlling current of about several A has a gate width of tens of μm to several cm in some cases although the size of the MOSFET is not specified.

Required withstanding voltage of the vehicle-mounted semiconductor device is 40V to 200V. To maintain the withstanding voltage, the width of the trench to be used is 0.5 μm to 2 μm. Also, in some cases, two or more narrow trenches are arranged and are used substantially as a wide trench.

Figure 2:
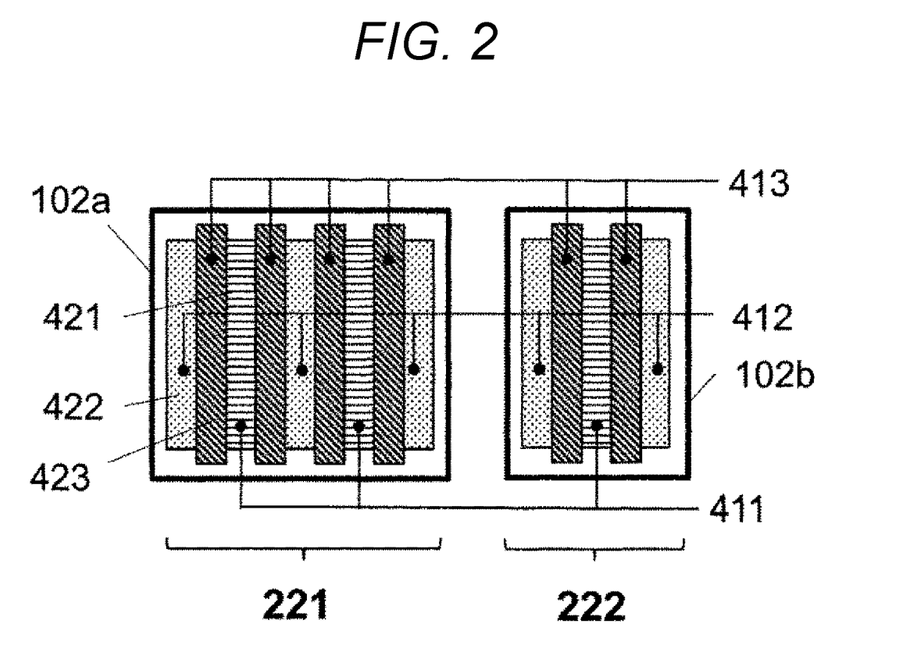
FIG. 2 illustrates an example of a method for connecting active elements according to the embodiment of the present invention.

FIG. 2 illustrates an example of a method for connecting the active elements according to the present embodiment of the present invention and illustrates an example of a method for connecting the plurality of active elements each constituted by one or a plurality of element pieces 101. As illustrated in FIG. 2, an active element 221 surrounded by a trench 102a is a MOSFET including a drain unit 421, a source unit 422, and a gate unit 423. The active element 221 is connected in parallel with an active element 222 surrounded by a different trench 102b and includes terminals 411, 412, and 413 connected to an outside. The terminals 411, 412, and 413 are connected to an external circuit, for example.

In the semiconductor device 300 illustrated in FIG. 1 (a), the active elements 201 and 205, the active elements 202 and 204, and the active element 203 respectively have different areas surrounded by the trenches 102 or different total areas of the element pieces 101 in regions surrounded by the trenches 102. In the present specification, the total area of the element pieces 101 in the region surrounded by the trench 102 will also be referred to as the area of the active element surrounded by the trench. In a case in which the areas of the active elements differ from each other, the heat generation amounts of the respective active elements at the time of operation differ. Thus, by controlling the sizes of the respective active elements, that is, by setting the numbers of element pieces in the respective trenches, the heat generation amounts generated in the respective trenches can differ from each other. As a result, the temperature distribution in the semiconductor device 300 can be controlled. In FIG. 1 (a), the active element 203 provided between the active elements 202 and 204 has a smaller area than those of the active elements 202 and 204. Accordingly, the heat generation amount of the active element 203 can be smaller than the heat generation amounts of the active elements 202 and 204.

Figure 1B:
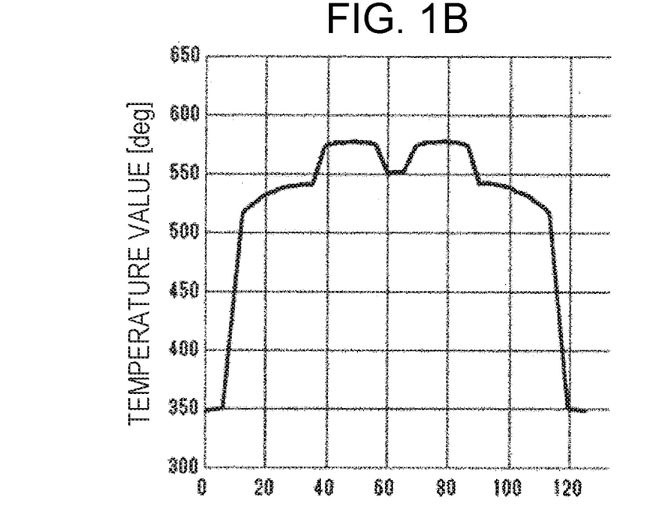
FIG. 1B is a temperature distribution graph obtained by a simulation.

FIG. 1(b) is a temperature distribution graph obtained by a simulation illustrating a temperature distribution along the line A-A' in the semiconductor device 300 derived by a simulation in a case in which current is equally supplied to all of the element pieces 101 in FIG. 1(a). Apparently, a temperature increase is restricted around the active element 203 by providing a region between the active elements 202 and 204 of the semiconductor device 300 with the active element 203 having a smaller area than those of the active elements 202 and 204.

Figure 3A:
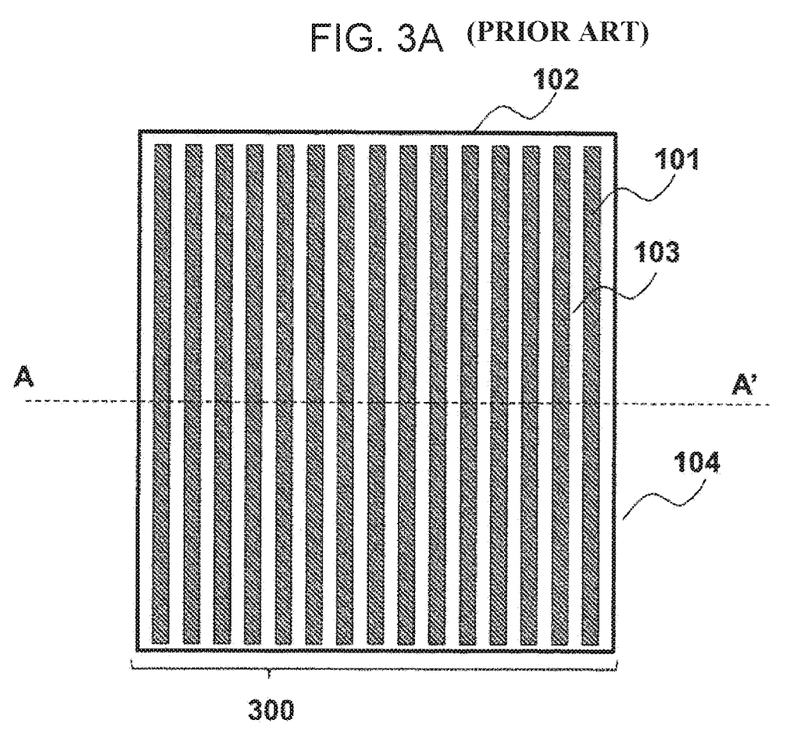
FIG. 3A is a plan view of a conventional semiconductor device.
Figure 3B:
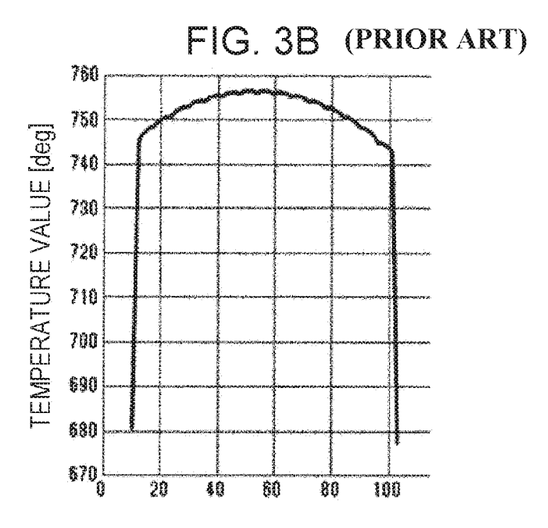
FIG. 3B is a temperature distribution graph obtained by a simulation.

FIG. 3(a) is a plan view schematically illustrating a conventional semiconductor device, and FIG. 3(b) is a temperature distribution graph obtained by a simulation. The semiconductor device 300 in FIG. 3(a) has only one active element insulated and separated by the trench 102. It is to be noted that the semiconductor device 300 in FIG. 3 is constituted by fifteen element pieces 101 and has as many element pieces as the semiconductor device 300 according to the embodiment illustrated in FIG. 1 does. Also, FIG. 3(b) illustrates a temperature distribution along the line A-A' in the semiconductor device 300 derived by a simulation in a case in which current is equally supplied to all of the element pieces 101 in FIG. 3(a).

In this temperature simulation, it is clear that FIG. 1 (b) and FIG. 3 (b) have different temperature distributions although the active element in the structure illustrated in FIG. 3 and the active elements in the structure illustrated in FIG. 1 are assumed to have equal abilities to pass current therethrough. In FIG. 3(b), in which the semiconductor device 300 has only one active element insulated and separated by the trench, the temperature in the device is the highest around the center of the device. On the other hand, in FIG. 1(b), to which the present invention has been applied, the temperature decreases at the center part of the device provided with the active element 203, which has a smaller area. Also, in a case of comparison in terms of the temperatures of all of the elements, it is clear that the temperatures are lower in the structure in FIG. 1, in which the active elements are separated by the trenches, than those in the structure in FIG. 3, in which the active element is not separated by the trench.

According to the above embodiment, shown in at least one of FIGS. 1a to 3b, the following effects can be obtained.

(1) The semiconductor device 300 includes a semiconductor substrate, the plurality of active elements 221 and 222 formed on the semiconductor substrate, the plurality of trenches 102a and 102b surrounding the plurality of active elements to insulate and separate the active elements, and the terminals 411, 412, and 413 connecting in parallel the plurality of active elements insulated and separated by different trenches among the plurality of trenches and connected to an outside. In the present embodiment, the active elements 221 and 222 connected in parallel are separated by the trenches 102a and 102b, respectively. Accordingly, in a case in which the total number of element pieces 101 is N in each of the conventional example and the embodiment, and in which the conventional example, in which the N element pieces are surrounded by one trench, and the embodiment, in which the N element pieces are surrounded respectively by the two trenches 102a and 102b, are compared, a temperature increase at the center part can be restricted further in the latter semiconductor device than in the former semiconductor device. That is, as in the embodiment, since two rows of trenches are provided between the two active elements of the semiconductor device, heat conduction between the active elements is restricted, and a temperature increase at a region between the active element 221 and the active element 222, that is, at the inside (center) region of the semiconductor device, can be restricted. In usual cases, the maximum temperature of the semiconductor device is often the temperature at the inside, in particular, at the center part, of the semiconductor device.

The plurality of active elements can be separated by a material (for example, silicon dioxide and quartz glass) having a higher insulation property and lower heat conductivity than silicon, for example. The temperature increase of the active elements can also be restricted by selection of such a material. As a matter of course, by restricting the temperature increase, resistance to breakdown of the active elements can be improved.

In comparison with the semiconductor device to which the spirit of PTL 1, in which increasing the distance between the active elements enables the equivalent temperature increase restriction effect to be achieved, has been applied, the size of the semiconductor device can be reduced. Further, by selecting as a material for the trenches a material having lower heat conductivity than silicon, the size of the semiconductor device can further be reduced.

(2) In the semiconductor device 300 according to the present embodiment, shown in at least one of FIGS. 1a to 3b, since the active elements 221 and 222 connected in parallel are separated by the trenches 102a and 102b, withstanding voltage of the active element can be improved with a smaller area than that in a case of using PN junction of a semiconductor.

(3) The semiconductor device 300 includes the first trench 102a and the second trench 102b, and an area surrounded by the first trench 102a or an area of the active element 221 surrounded by the first trench 102a and an area surrounded by the second trench 102b or an area of the active element 222 surrounded by the second trench 102b differ from each other. In the present embodiment, the areas surrounded by the trenches or the areas of the active elements are controlled to control the heat generation amounts of the respective active elements at the time of operation. Accordingly, heat generation is restricted, or heat dissipation is facilitated, at a high-temperature part of the active element having a large heat generation amount, and a local temperature increase of the active element can be restricted.

Second Embodiment

Figure 4A:
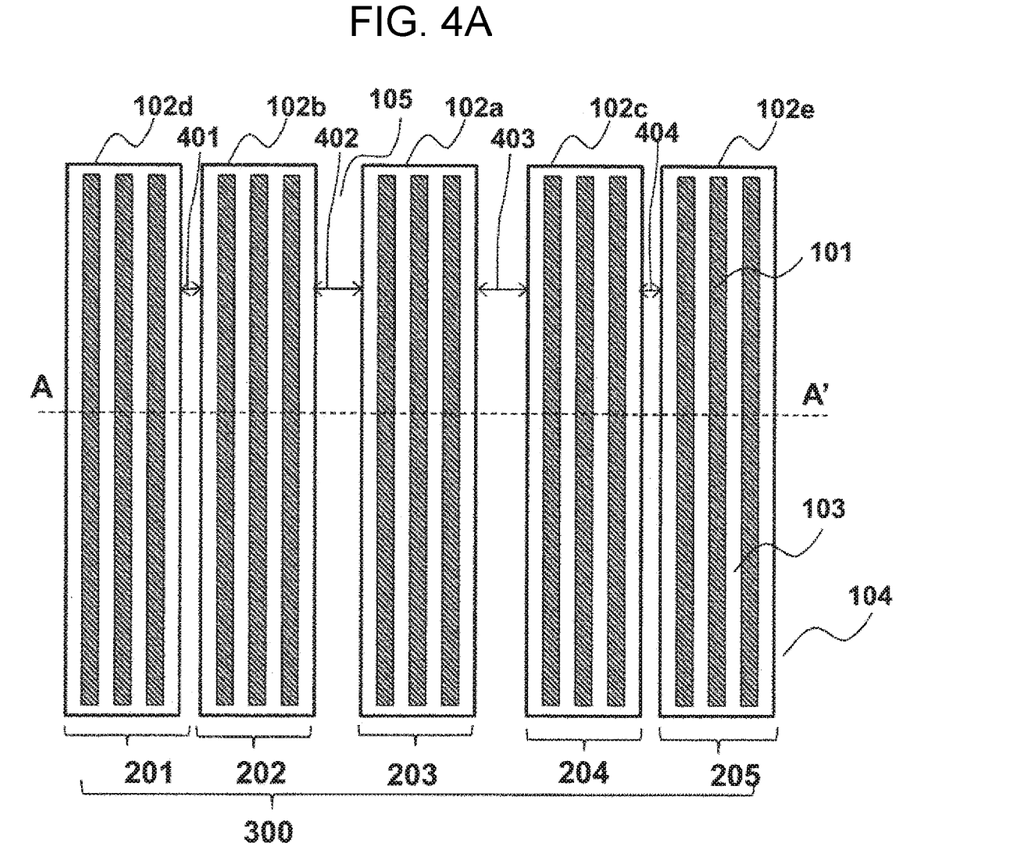
FIG. 4 is a plan view of a semiconductor device according to a second embodiment of the present invention.

FIG. 4(a) is a plan view schematically illustrating a semiconductor device according to a second embodiment of the present invention and illustrates the semiconductor device 300 in which the plurality of active elements 201 to 205 formed by insulating and separating the element pieces 101 by means of trenches 102a to 102e are connected in parallel. The semiconductor device 300 according to the second embodiment is characterized in that distances 401 to 404 between the trenches insulating and separating the element pieces differ from each other. Since the longer distance between the trenches causes the heat dissipation amount to be increased, the temperature in the semiconductor device 300 can be decreased.

Figure 4B:
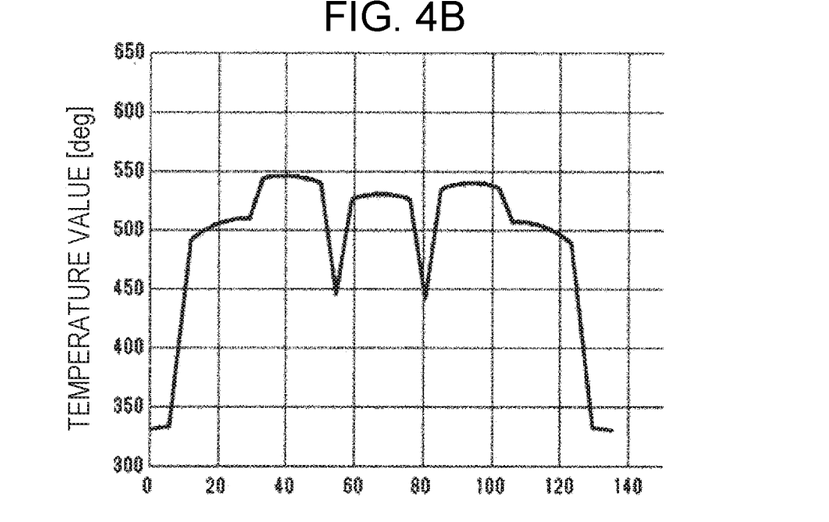

FIG. 4(b) is a temperature distribution graph obtained by a simulation illustrating a temperature distribution along the line A-A' in the semiconductor device 300 derived by a simulation in a case in which current is equally supplied to all of the element pieces 101 in FIG. 4(a). Apparently, the temperature of the part corresponding to the active element 203 having the distances 402 and 403, which are longer than the distances 401 and 404 between the trenches, is lower than that of the peripheral part.

According to the above embodiment, the following effect, as well as the similar effects to those in the first embodiment, can be obtained.

(4) The semiconductor device 300 includes the first trench 102a, the second trenches 102b and 102c, and the third trenches 102d and 102e. The distances 402 and 403 between the first trench 102a and the second trenches 102b and 102c and the distances 401 and 404 between the second trenches 102b and 102c and the third trenches 102d and 102e differ. A space between the trenches insulating and separating the active elements can be broadened at a location in the semiconductor device 300 at which the temperature is locally high. As a result, heat dissipation is facilitated. Thus, a temperature increase in the semiconductor device 300 can be restricted.

Third Embodiment

Figure 5:
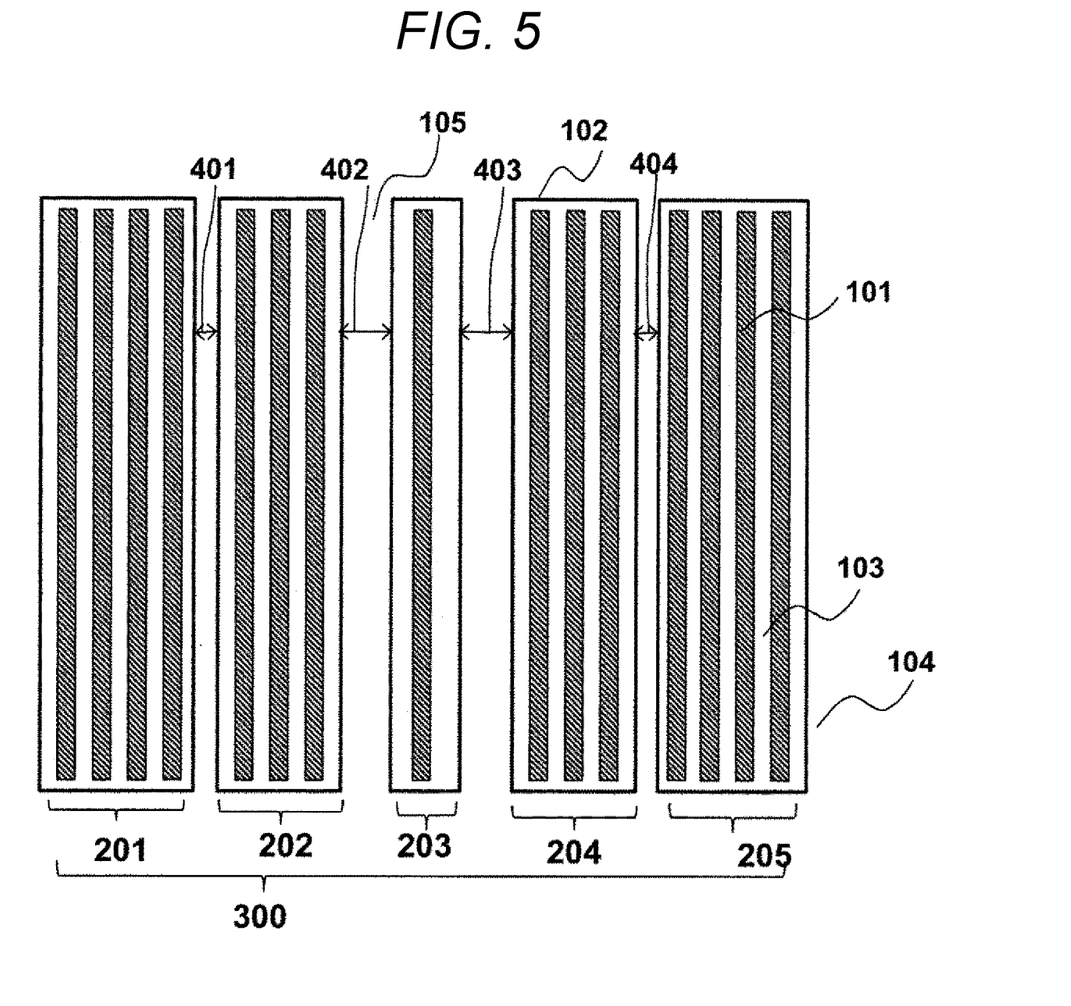
FIG. 5 is a plan view of a semiconductor device according to a third embodiment of the present invention.

FIG. 5 is a plan view schematically illustrating a semiconductor device according to a third embodiment of the present invention and illustrates the semiconductor device 300 in which the plurality of active elements 201 to 205 formed by insulating and separating the element pieces 101 by means of the trenches 102 are connected in parallel.

The third embodiment illustrated in FIG. 5 is a device having both the structure according to the first embodiment and the characteristics according to the second embodiment. That is, the active element 203 provided between the active elements 202 and 204 is smaller in area than the active elements 202 and 204, and the distances 401 to 404 differ. According to the third embodiment, a temperature increase at the center part (part provided with the active element 203) of the device, at which the temperature increases during operation of the semiconductor device, can further be restricted as described in the first and second embodiments. By setting the number of trenches, the distances between the trenches, the number of element pieces to be provided in each trench, and the like, the temperature distribution in the semiconductor device 300 can be controlled. As a result, heat dissipation at a location in the semiconductor substrate at which the temperature is locally high can be facilitated, and the heat generation distribution on the semiconductor substrate can be uniform.

Fourth Embodiment

Figure 6:
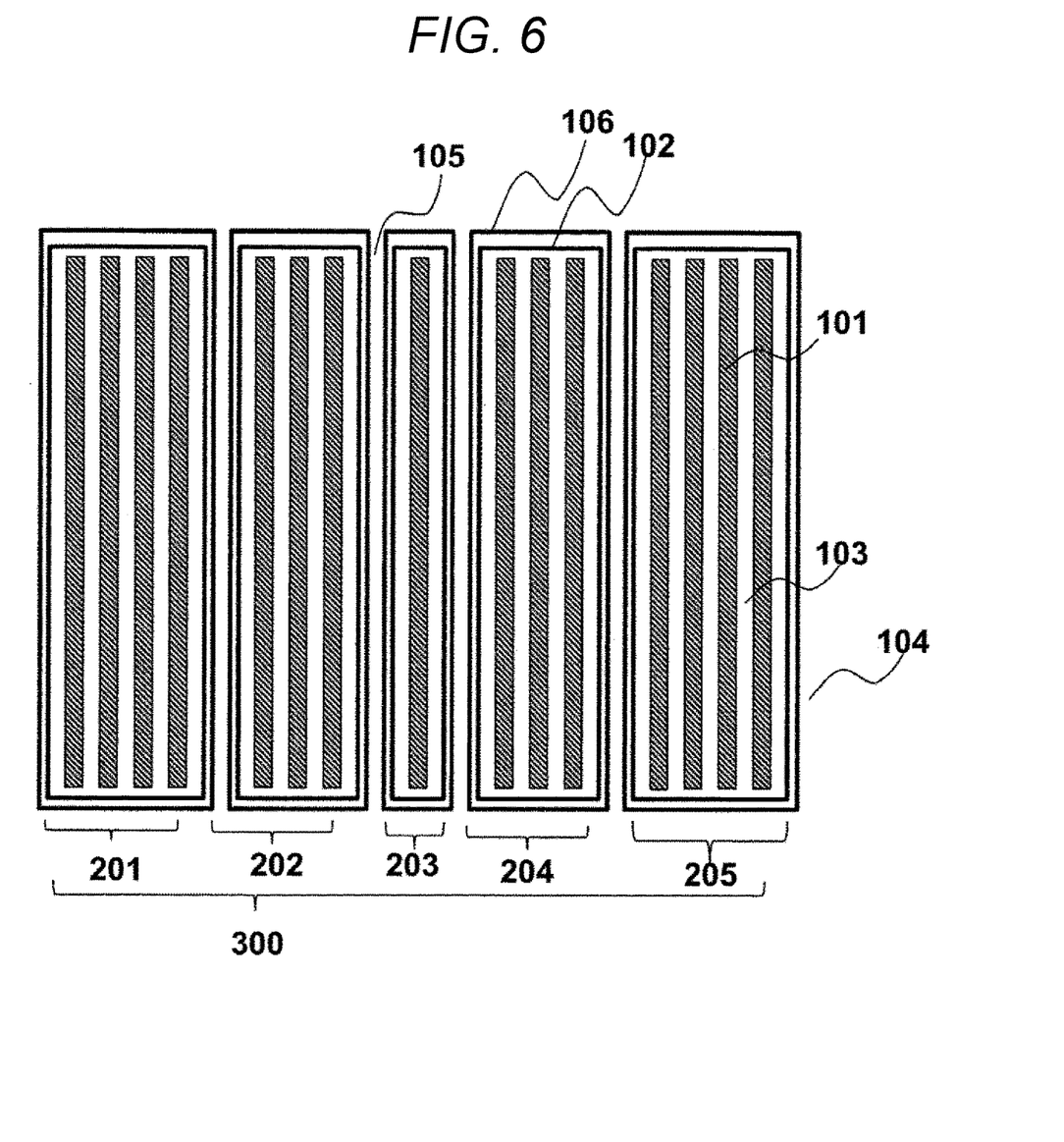
FIG. 6 is a plan view of a semiconductor device according to a fourth embodiment of the present invention.

FIG. 6 is a plan view schematically illustrating a semiconductor device according to a fourth embodiment of the present invention and illustrates the semiconductor device 300 in which the plurality of active elements 201 to 205 formed by insulating and separating the element pieces 101 by means of the trenches 102 are connected in parallel.

The fourth embodiment illustrated in FIG. 6 has a structure in which the trenches 102 as in the first embodiment are further surrounded by trenches 106. By surrounding each of the active elements with use of the double trench, the present embodiment exerts an effect of making it more difficult for heat from the outside of the trenches to be transmitted to the active element inside the trenches and making it difficult for the active element to be influenced by the heat outside the trenches surrounding the active element. In the present embodiment, the number of trenches separating the active element is two. However, using three or more trenches can exert the similar effect.

Fifth Embodiment

Figure 7:
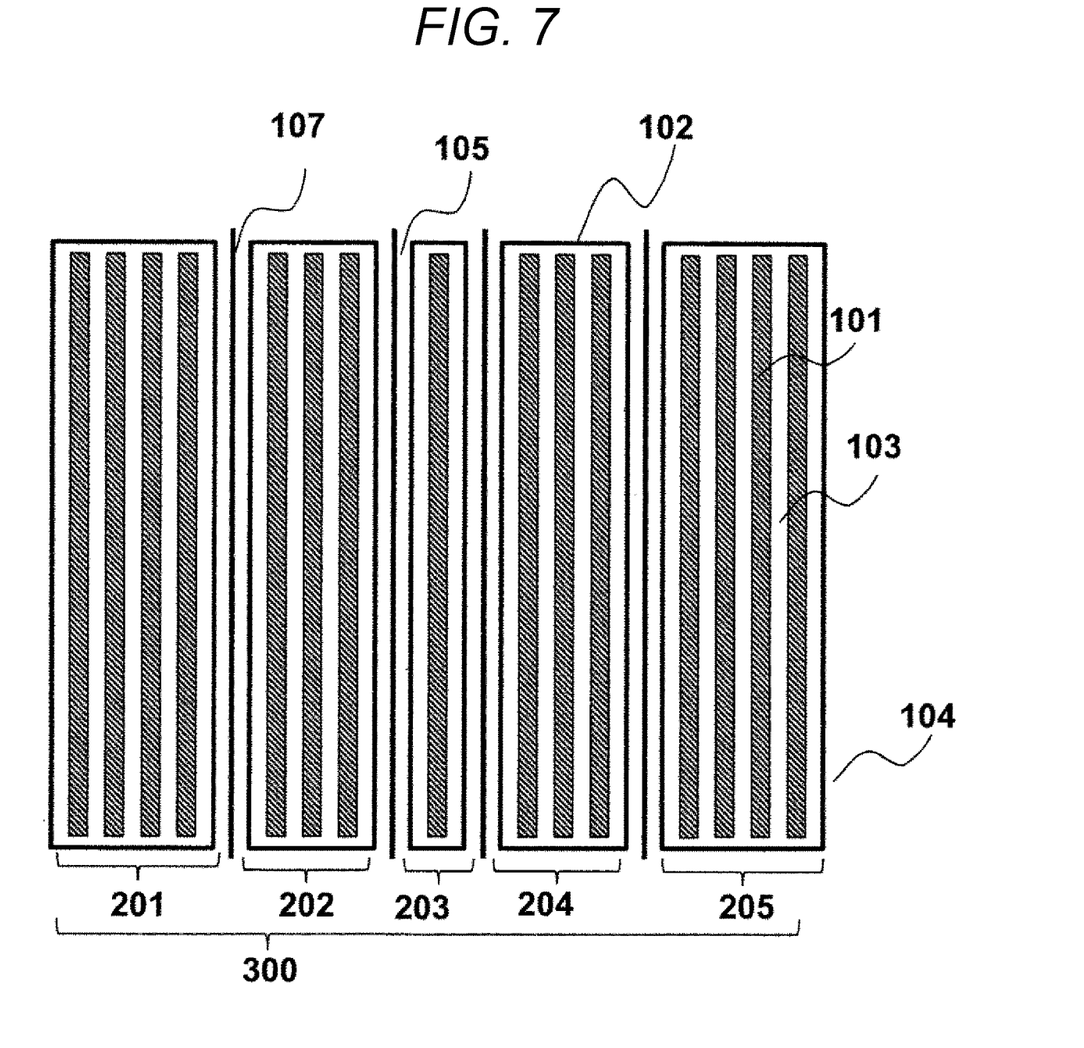
FIG. 7 is a plan view of a semiconductor device according to a fifth embodiment of the present invention.

FIG. 7 is a plan view schematically illustrating a semiconductor device according to a fifth embodiment of the present invention. The fifth embodiment illustrated in FIG. 7 has a structure in which each of inter-trench spaces 105 as in the first embodiment is provided with a trench 107 adapted to shield against heat. Similarly to the fourth embodiment, the fifth embodiment exerts an effect of shielding against heat of the adjacent active element by means of the trench 107 and making it difficult for the active element to be influenced by the heat.

Sixth Embodiment

Figure 8:
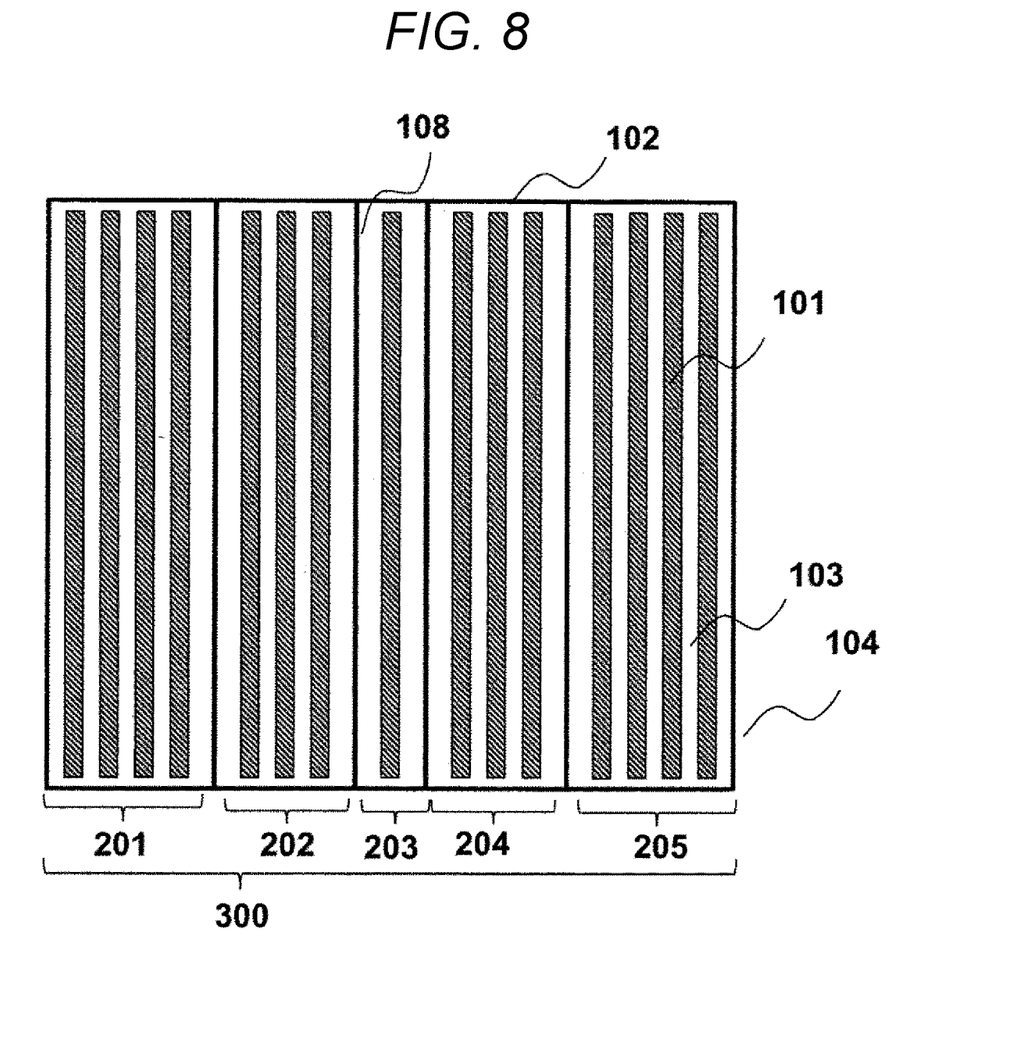
FIG. 8 is a plan view of a semiconductor device according to a sixth embodiment of the present invention.

FIG. 8 is a plan view schematically illustrating a semiconductor device according to a sixth embodiment of the present invention. In addition to the structure of the first embodiment of the present invention, the sixth embodiment illustrated in FIG. 8 has a structure in which the adjacent active elements have in common a trench 108 insulating and separating the active elements from each other. This structure exerts an effect of reducing the entire area of the semiconductor device 300 as much as the reduction of each of the spaces between the adjacent trenches.

Seventh Embodiment

Figure 9:
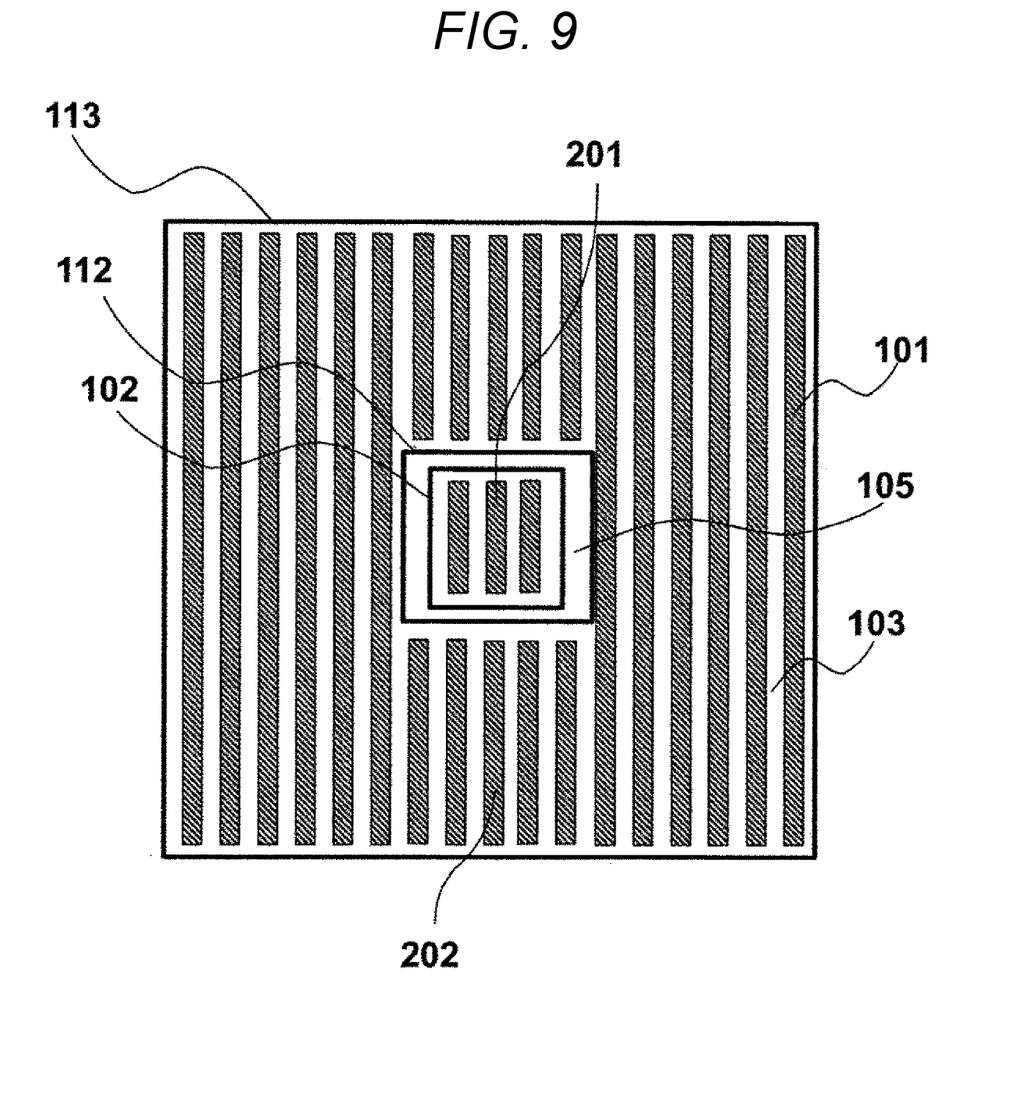
FIG. 9 is a plan view of a semiconductor device according to a seventh embodiment of the present invention.

FIG. 9 is a plan view schematically illustrating a semiconductor device according to a seventh embodiment of the present invention. In the seventh embodiment illustrated in FIG. 9, the two active elements 201 and 202 in the semiconductor device 300 having different areas are separated by trenches 102, 112, and 113. According to the present embodiment, a temperature increase of the active element 202 at the center part of the semiconductor device 300 can be reduced.

Next, a configuration example of the semiconductor device according to each of the aforementioned first to seventh embodiments will briefly be described. In the following description, a first conductivity type is an n-type while a second conductivity type is a p-type. However, the opposite can also be a configuration example. Examples of the effective active element in the present invention are a MOSFET, an IGBT, and a bipolar transistor, and an embodiment using a MOSFET will briefly be described with reference to FIG. 10.

Figure 10:
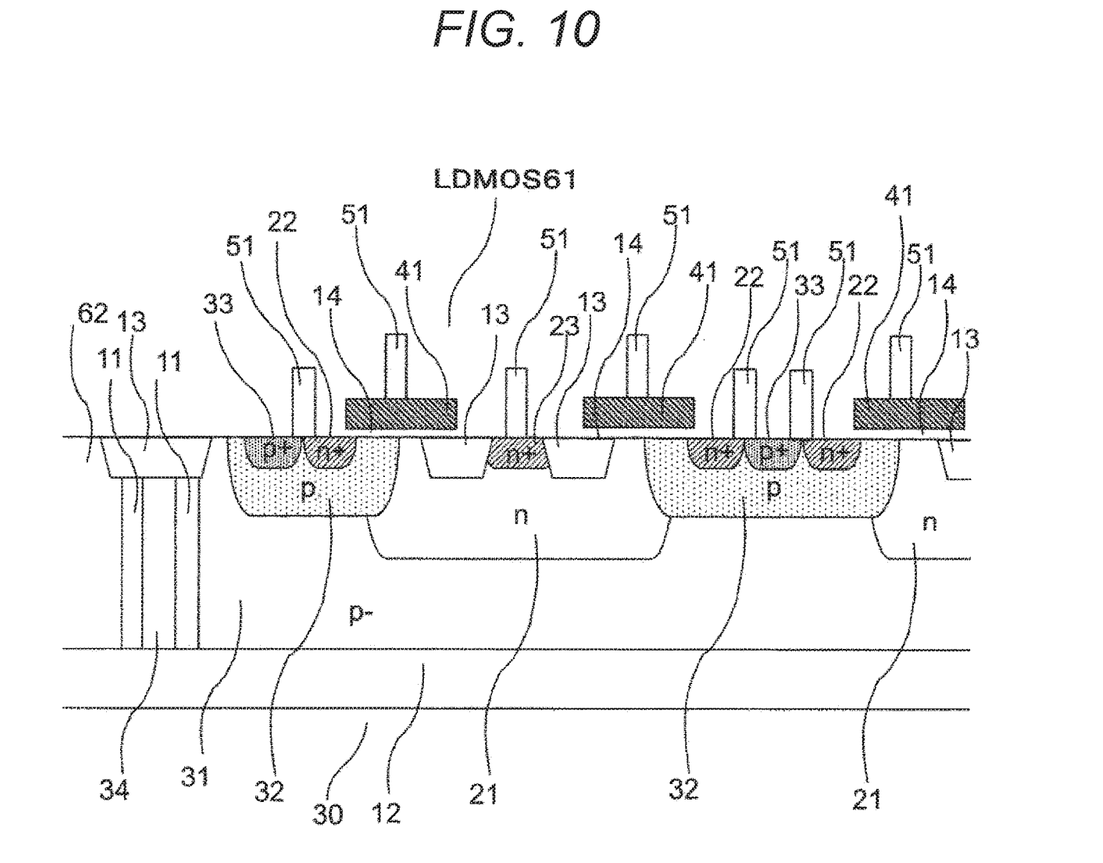
FIG. 10 illustrates an example of a cross-sectional structure of the semiconductor device according to each of the first to seventh embodiments of the present invention.

FIG. 10 schematically illustrates an example of a cross-sectional structure of the semiconductor device according to each of the first to seventh embodiments of the present invention and illustrates a MOSFET formed on an SOI (silicon on insulator) substrate and including trenches, particularly, an n-type LDMOS (lateral double-diffused MOSFET) 61 for use as a high withstanding voltage semiconductor element. The SOI substrate consists of a support substrate (silicon substrate) 30, a buried oxide film 12, and a second conductivity type silicon layer 31 forming a semiconductor element. The thickness of the buried oxide film 12 is 0.5 μm to 3 μm, and the thickness of the silicon layer 31 is approximately 1 μm to 8 μm.

In the LDMOS 61, a gate oxide film 14 is provided at the upper part with a first conductivity type gate polysilicon layer 41 and at the lower part with a second conductivity type well 32. The well 32 is connected to a second conductivity type silicon layer 33 containing dopant in high concentration. A source region of the LDMOS 61 is a silicon layer 22 containing first conductivity type dopant in high concentration while a drain region of the LDMOS 61 is a silicon layer 23 containing first conductivity type dopant in high concentration. In the LDMOS 61 illustrated in FIG. 10, the source regions 22 are arranged symmetrically across the drain region 23.

When voltage is applied to the gate polysilicon layer 41, and a first conductivity type inversion layer is formed around an interface between the second conductivity type well 32 and the gate oxide film 41, the source 22 and the drain 23 are electrically connected via a first conductivity type drift region 21. The first conductivity type drift region 21 is an electric field grading layer and is installed for electric field grading to prevent silicon from breaking down even when high voltage is applied to the drain 23. In general, in a case in which the drift layer 21 is broadened to keep a long distance between the source 22 and the drain 23, breakdown voltage (withstanding voltage) is raised, and resistance between the source and the drain is raised. The opposite is true. In a case in which the drift layer 21 is shrunk to keep a short distance between the source and the drain, resistance between the source and the drain is lowered, and breakdown voltage (withstanding voltage) is lowered.

The LDMOS 61 is electrically insulated and separated from an adjacent element 62 and an inter-trench space region 34 with use of trenches 11 and an element separation layer 13. The element separation layer 13 generally employs a LOCOS (local oxidation of silicon) process, an STI (shallow trench isolation) process, or the like, and FIG. 10 illustrates the STI process. The gate polysilicon layer 41, the well 32, the source 22, and the drain 23 are connected to a metal interconnection line 51. In particular, the well 32 and the source 22 are connected to an interconnection layer of the same node. As a material for the metal interconnection line 51, tungsten, aluminum, copper, or the like is used as needed.

In the description of the above embodiments, the present invention is applied to a semiconductor device to be mounted in a vehicle. However, the present invention is not limited to the semiconductor device to be mounted in a vehicle.

Although various embodiments and modification examples have been described above, the present invention is not limited to these. Other aspects conceivable within the scope of the technical idea of the present invention are included in the scope of the present invention.

REFERENCE SIGNS LIST 11 trench
12 buried oxide film
13 element separation layer (STI)
14 gate oxide film
21 first conductivity type drift region
22 source region
23 drain region
30 support substrate
31 second conductivity type silicon layer
32 second conductivity type well
33 second conductivity type silicon layer containing dopant in high concentration
34 inter-trench space region
41 first conductivity type polysilicon layer
51 metal interconnection line
61 LDMOS
62 adjacent element
101 element piece
102, 102a, 102b, 102c, 102d, 102e trench for insulating and separating active elements
103 active region
104 inactive region outside trench
105 inter-trench space
106 trench outside trench 102
107 trench for shielding inter-trench space 105 against heat
108 trench for insulation and separation that adjacent active elements have in common
112 trench for insulating and separating active elements
113 trench for insulating and separating active elements
201 to 211, 221, 222 active element insulated and separated by trench
300 semiconductor device
421 drain unit
422 source unit
423 gate unit
411 drain terminal
412 source terminal
413 gate terminal

The invention claimed is:
1. A vehicle-mounted semiconductor device comprising:
a semiconductor substrate;

a plurality of active elements formed on the semiconductor substrate, wherein each of the plurality of active elements comprises at least one element piece;
a plurality of trenches surrounding the plurality of active elements to insulate and separate the active elements, wherein each active element is surrounded by a single trench; and
a terminal connecting in parallel the plurality of active elements insulated and being connected to an outside, wherein
the plurality of active elements include a first active element, a second active element immediately adjacent to the first active element, a third active element immediately adjacent to the second active element, a fourth active element immediately adjacent to the third active element, and a fifth active element immediately adjacent to the fourth active element,
the second and fourth active elements have more element pieces than the third active element, and the first and fifth active elements have more element pieces than both the second active element and the fourth active element, and
a distance between the first active element and the second active element is smaller than a distance between the second active element and the third active element.

2. The vehicle-mounted semiconductor device according to claim 1, wherein
the single trench surrounding the first active element is a first trench and the single trench surrounding the second active element is a second trench, and
an area surrounded by the first trench or an area of the active element surrounded by the first trench and an area surrounded by the second trench or an area of the active element surrounded by the second trench differ.

3. The vehicle-mounted semiconductor device according to claim 1, wherein
the single trench surrounding the first active element is a first trench, the single trench surrounding the second active element is a second trench, and the third active element has a third trench, and
a distance between the first trench and the second trench and a distance between the second trench and the third trench differ.

4. The vehicle-mounted semiconductor device according to claim 1, wherein
the single trench surrounding a fourth active element is a fourth trench surrounds a fourth active element;
an area surrounded by of the fourth trench is smaller than an area surrounded by of the first trench and an area surrounded by of the second trench.

5. The vehicle-mounted semiconductor device according to claim 2, wherein
a total number of element pieces provided is set so that a first heat generation amount and a second heat generation amount differ when the terminal is connected to an external circuit to drive the vehicle-mounted semiconductor device.

6. The vehicle-mounted semiconductor device according to claim 5, wherein
at least the distance between the trenches, and the number of element pieces provided are set so that a heat generation distribution on the semiconductor substrate is uniform.

7. The vehicle-mounted semiconductor device according to claim 1, wherein
an area surrounded each trench is smaller as the trench is closer to a center part of the semiconductor substrate.

8. The vehicle-mounted semiconductor device according to claim 1, wherein
the terminal includes an input terminal, a control terminal, and an output terminal, and
the input terminal is connected to respective input units of the plurality of active elements, the control terminal is connected to respective control units of the plurality of active elements, and the output terminal is connected to respective output units of the plurality of active elements.

9. The vehicle-mounted semiconductor device according to claim 1, wherein the vehicle-mounted semiconductor device is a MOSFET, the input terminal is a drain terminal, the control terminal is a gate terminal, and the output terminal is a source terminal.

10. The vehicle-mounted semiconductor device according to claim 1, wherein
the semiconductor substrate is an SOI substrate, and
a depth of at least one trench is equal to a thickness of an Si active layer.

* * * * *